US012771358B2

United States Patent

Lo et al.

(10) Patent No.: US 12,771,358 B2

(45) Date of Patent: Oct. 20, 2026

(54) MULTI-PATH RADIO FREQUENCY SYSTEM USING LOCAL OSCILLATION SIGNALS WITH FREQUENCIES HAVING NON-INTEGER MULTIPLE RELATIONSHIP THAT ARE GENERATED FROM SAME REFERENCE OSCILLATION SIGNAL AND ASSOCIATED LOCAL OSCILLATION SIGNAL GENERATION METHOD

(71) Applicant: MEDIATEK INC., Hsinchu City (TW)

(72) Inventors: An-Hsun Lo, Hsinchu City (TW); Yi-Ju Yang, Hsinchu City (TW); Tzung-Han Wu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 0 days.

(21) Appl. No.: 19/010,200

(22) Filed: Jan. 6, 2025

(65) Prior Publication Data

US 2025/0253829 A1 Aug. 7, 2025

Related U.S. Application Data

(60) Provisional application No. 63/550,678, filed on Feb. 7, 2024.

(51) Int. Cl.

*H03K 23/68* (2006.01)

*H03D 1/22* (2006.01)

(Continued)

(52) U.S. Cl.

CPC .......... *H03K 23/68* (2013.01); *H03D 1/2245* (2013.01); *H03D 3/007* (2013.01); *H03D 7/00* (2013.01);

(Continued)

(58) Field of Classification Search

CPC .......... H03K 23/68; H03D 2200/0088; H03D 7/00; H03D 7/12; H03D 1/2245;

(Continued)

(56) References Cited

U.S. PATENT DOCUMENTS 8,723,568 B1 * 5/2014 Terrovitis .................. H03L 7/16 327/148

10,386,444 B1 8/2019 Stickle (Continued)

FOREIGN PATENT DOCUMENTS

| | | |
|---|---|---|
| CN | 106537782 A | 3/2017 |
| EP | 2 717 480 A1 | 4/2014 |
| EP | 2 896 130 B1 | 7/2017 |
| TW | 201108621 A1 | 3/2011 |

OTHER PUBLICATIONS

Chen, Reconfigurable Dual-Channel Multiband RF Receiver for GPS/Galileo/BD-2 Systems, IEEE Transactions on Microwave Theory and Techniques, vol. 60, No. 11, pp. 3491-3501, Nov. 2012.

(Continued)

*Primary Examiner* — Ryan Johnson

(74) *Attorney, Agent, or Firm* — Winston Hsu

(57) ABSTRACT

A multi-path radio frequency (RF) system includes a reference oscillation circuit, a local oscillation (LO) generator circuit, and mixer circuits. The reference oscillation circuit generates a reference oscillation signal. The LO generator circuit receives the reference oscillation signal, and generates LO signals according to the reference oscillation signal, where a frequency of the reference oscillation signal is a non-integer multiple of a frequency of at least one of the LO signals. The mixer circuits are located on different signal paths, respectively, and used to receive the LO signals from the LO generator circuit, respectively.

19 Claims, 11 Drawing Sheets

(51) Int. Cl.

| | |
|---|---|
| ***H03D 3/00*** | (2006.01) |
| ***H03D 7/00*** | (2006.01) |
| ***H04B 1/04*** | (2006.01) |
| ***H04B 1/16*** | (2006.01) |
| ***H04B 1/40*** | (2015.01) |
| ***H04L 27/34*** | (2006.01) |
| ***H04L 27/36*** | (2006.01) |
| ***H04L 27/38*** | (2006.01) |

(52) U.S. Cl.

CPC ............. *H04B 1/0483* (2013.01); *H04B 1/16* (2013.01); *H04B 1/40* (2013.01); *H04L 27/34* (2013.01); *H04L 27/36* (2013.01); *H04L 27/38* (2013.01); *H03D 2200/0088* (2013.01)

(58) Field of Classification Search

CPC ............ H03D 3/007; H04B 1/04; H04B 1/16; H04B 1/0483; H04L 27/34; H04L 27/36; H04L 27/38

See application file for complete search history.

(56) References Cited

U.S. PATENT DOCUMENTS

| | | | | |
|---|---|---|---|---|
| 2014/0092892 | A1* | 4/2014 | Hung ..................... | H03B 28/00<br>370/345 |
| 2017/0244433 | A1* | 8/2017 | Cha .......................... | H04B 1/04 |
| 2018/0358992 | A1 | 12/2018 | Fernando | |

OTHER PUBLICATIONS

Lee, Ultralow-Power 2.4-GHz Receiver With All Passive Sliding-IF Mixer, IEEE Transactions on Microwave Theory and Techniques, vol. 66, No. 5, pp. 2356-2362, May 2018.

Yang, A Parallel Sliding-IF Receiver Front-End With Sub-2-dB Noise Figure for 5-6-GHz WLAN Carrier Aggregation, IEEE Journal of Solid-State Circuits, vol. 56, No. 2, pp. 392-403, Feb. 2021.

* cited by examiner

MULTI-PATH RADIO FREQUENCY SYSTEM USING LOCAL OSCILLATION SIGNALS WITH FREQUENCIES HAVING NON-INTEGER MULTIPLE RELATIONSHIP THAT ARE GENERATED FROM SAME REFERENCE OSCILLATION SIGNAL AND ASSOCIATED LOCAL OSCILLATION SIGNAL GENERATION METHOD

CROSS REFERENCE TO RELATED APPLICATIONS

This application claims the benefit of U.S. Provisional Application No. 63/550,678, filed on Feb. 7, 2024. The content of the application is incorporated herein by reference.

BACKGROUND

The present invention relates to wireless communications, and more particularly, to a multi-path radio frequency (RF) system using local oscillation (LO) signals with frequencies having a non-integer multiple relationship that are generated from the same reference oscillation signal and an associated LO signal generation method.

A wireless communication device may include a mixer, an LO generator (LOGEN), and a voltage-controlled oscillator (VCO). The VCO is a frequency source for providing a reference oscillation signal with a reference frequency. The LOGEN receives the reference oscillation signal from the VCO, and provides an LO signal with a desired LO frequency to the mixer for up-conversion or down-conversion. In a case where the wireless communication device is a wireless receiver, the mixer down-converts an RF signal with an RF frequency to generate a baseband (BB) signal, where the LO frequency is equal to or around the RF frequency. In another case where the wireless communication device is a wireless transmitter, the mixer up-converts a BB signal to generate an RF signal with an RF frequency, where the LO frequency is equal to or around the RF frequency. The reference frequency of the reference oscillation signal provided by the VCO is usually an even multiple of the RF frequency.

A dual-path communication system may have two signal paths for dealing with different RF frequencies. When one RF frequency is a non-integer multiple of the other RF frequency, one conventional dual-path communication system design may use multiple VCOs with different VCO frequencies, or may have a multi-stage mixer (which consists of mixers connected in series) on each signal path. However, using multiple VCOs wastes power consumption and chip area, and using a multi-stage mixer with a large chip area results in signal loss and requires a larger LO driving current.

SUMMARY

One of the objectives of the claimed invention is to provide a multi-path RF system using LO signals with frequencies having a non-integer multiple relationship that are generated from the same reference oscillation signal and an associated LO signal generation method.

According to a first aspect of the present invention, an exemplary multi-path RF system is disclosed. The exemplary multi-path RF system includes a reference oscillation circuit, an LO generator circuit, and a plurality of mixer circuits. The reference oscillation circuit is configured to generate a reference oscillation signal. The LO generator circuit is configured to receive the reference oscillation signal, and generate a plurality of LO signals according to the reference oscillation signal, wherein a frequency of the reference oscillation signal is a non-integer multiple of a frequency of at least one of the plurality of LO signals. The plurality of mixer circuits are located on a plurality of signal paths, respectively, and configured to receive the plurality of LO signals from the LO generator circuit, respectively.

According to a second aspect of the present invention, an exemplary LO signal generation method is disclosed. The exemplary LO signal generation method includes: receiving a reference oscillation signal generated from a reference oscillation circuit; generating a plurality of LO signals according to the reference oscillation signal, where a frequency of the reference oscillation signal is a non-integer multiple of a frequency of at least one of the plurality of LO signals; and outputting the plurality of LO signals to a plurality of mixer circuits that are located on a plurality of signal paths, respectively.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names.

This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
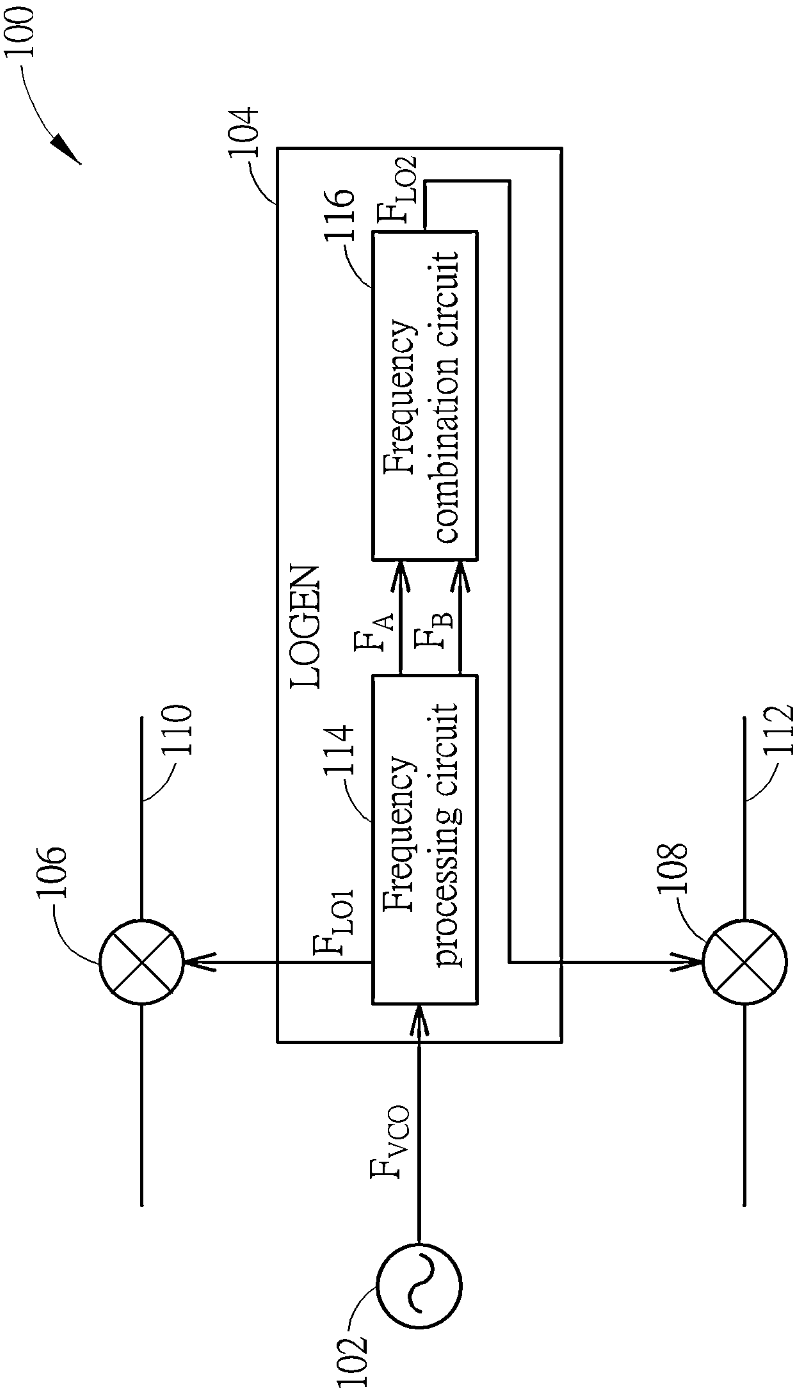
FIG. 1 is a diagram illustrating a multi-path RF system according to an embodiment of the present invention.

FIG. 1 is a diagram illustrating a multi-path RF system according to an embodiment of the present invention. For better comprehension of technical features of the present invention, the following assumes that the multi-path RF system 100 is a dual-path RF system. In practice, the proposed multi-path RF system can have mixers located on more than two signal paths. The multi-path RF system 100 includes a reference oscillation circuit 102, an LO generator circuit (labeled by "LOGEN") 104, and a plurality of mixer circuits 106 and 108. The reference oscillation circuit 102 is configured to generate a reference oscillation signal $F_{VCO}$. For example, the reference oscillation circuit 102 may be implemented using a VCO or any controllable oscillator. It should be noted that the reference oscillation signal $F_{VCO}$ may include a plurality of signals with the same frequency $f_{VCO}$ but different phases. For example, the reference oscillation signal $F_{VCO}$ may be a differential output of the reference oscillation circuit 102, and may include two signals with different phases 0° and 180°.

The LO generator circuit 104 is configured to receive the reference oscillation signal $F_{VCO}$, and generate a plurality of LO signals $F_{LO1}$ and $F_{LO2}$ according to the same reference oscillation signal $F_{VCO}$, where a frequency $f_{VCO}$ of the reference oscillation signal $F_{VCO}$ is a non-integer multiple of a frequency of at least one of the LO signals $F_{LO1}$ and $F_{LO2}$. For example, the frequency $f_{VCO}$ (e.g., 3.2 GHz) of the reference oscillation signal $F_{VCO}$ may be an integer multiple of the frequency $f_{Lo1}$ (e.g., 1.6 GHz) of the LO signals $F_{LO1}$, and the frequency $f_{VCO}$ (e.g., 3.2 GHz) of the reference oscillation signal $F_{VCO}$ may be a non-integer multiple of the frequency $f_{LO2}$ (e.g., 1.2 GHz) of the LO signals $F_{LO2}$. It should be noted that each of the LO signals $F_{LO1}$ and $F_{LO2}$ may include a plurality of signals with the same frequency $f_{LO1}/f_{LO2}$ but different phases. For example, each of the LO signals $F_{LO1}$ and $F_{LO2}$ may include two signals with different phases 0° and 90°. For another example, each of the LO signals $F_{LO1}$ and $F_{LO2}$ may include four signals with different phases 0°, 90°, 180°, and 270°. In some embodiments of the present invention, each of the LO signals $F_{LO1}$ and $F_{LO2}$ may have a 25% duty cycle to meet requirements of a wireless communication system using the proposed multi-path RF system (e.g., dual-path RF system) 100.

The mixer circuits 106 and 108 are located on different signal paths 110 and 112, respectively, and are configured to receive the LO signals $F_{LO1}$ and $F_{LO2}$ from the LO generator circuit 104, respectively. Each of the signal paths 110 and 112 may be a transmit (TX) path or a receiver (RX) path. In other words, each of the mixer circuits 106 and 108 may be used for up-conversion or down-conversion, depending upon actual design considerations.

Figure 2:
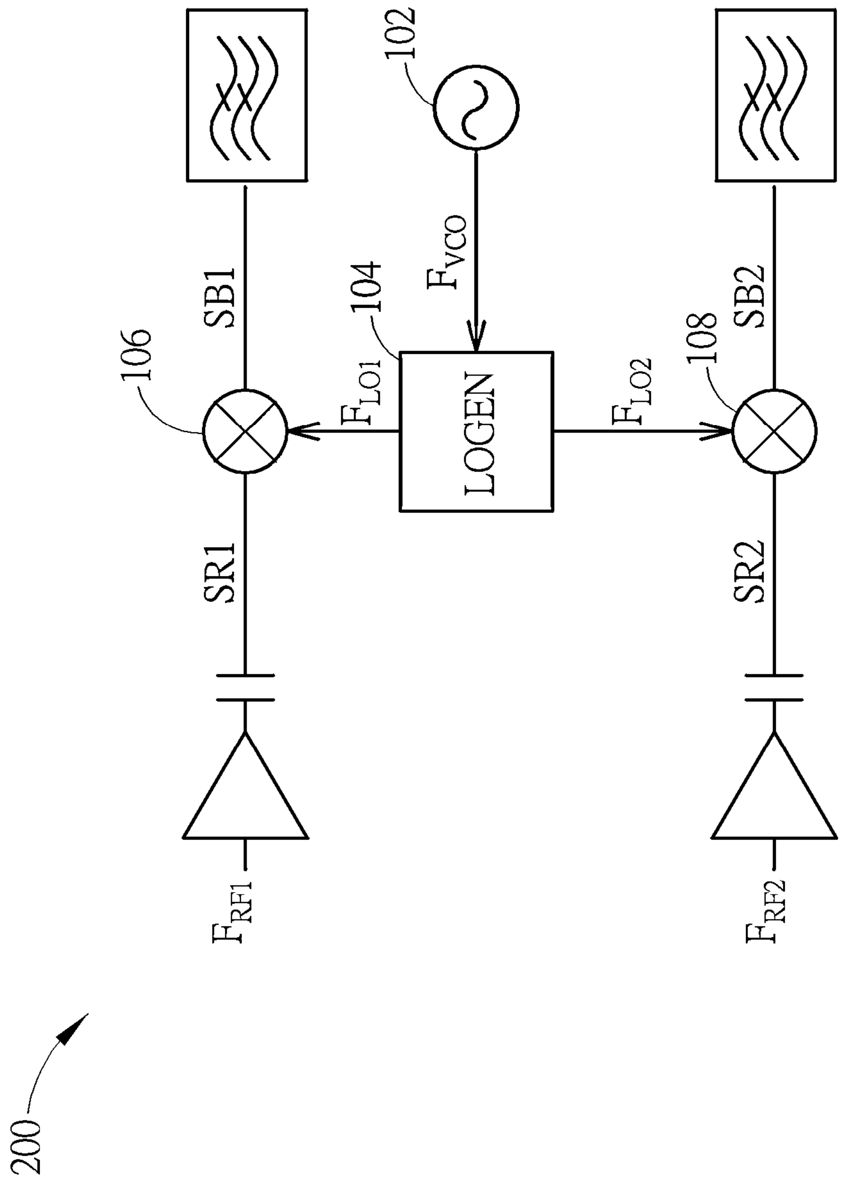
FIG. 2 is a diagram illustrating a first wireless communication system using the proposed RF system shown in FIG. 1 according to an embodiment of the present invention.

FIG. 2 is a diagram illustrating a first wireless communication system 200 using the proposed RF system 100 shown in FIG. 1 according to an embodiment of the present invention. In this embodiment, the mixer circuit 106 is located on one RX path for performing down-conversion upon an RF signal SR1 with an RF frequency $F_{RF1}$ to generate a BB signal SB1, and the mixer circuit 108 is located on another RX path for performing down-conversion upon an RF signal SR2 with an RF frequency $F_{RF2}$ to generate a BB signal SB2, where the RF frequencies $F_{RF1}$ and $F_{RF2}$ have a non-integer multiple relationship.

Figure 3:
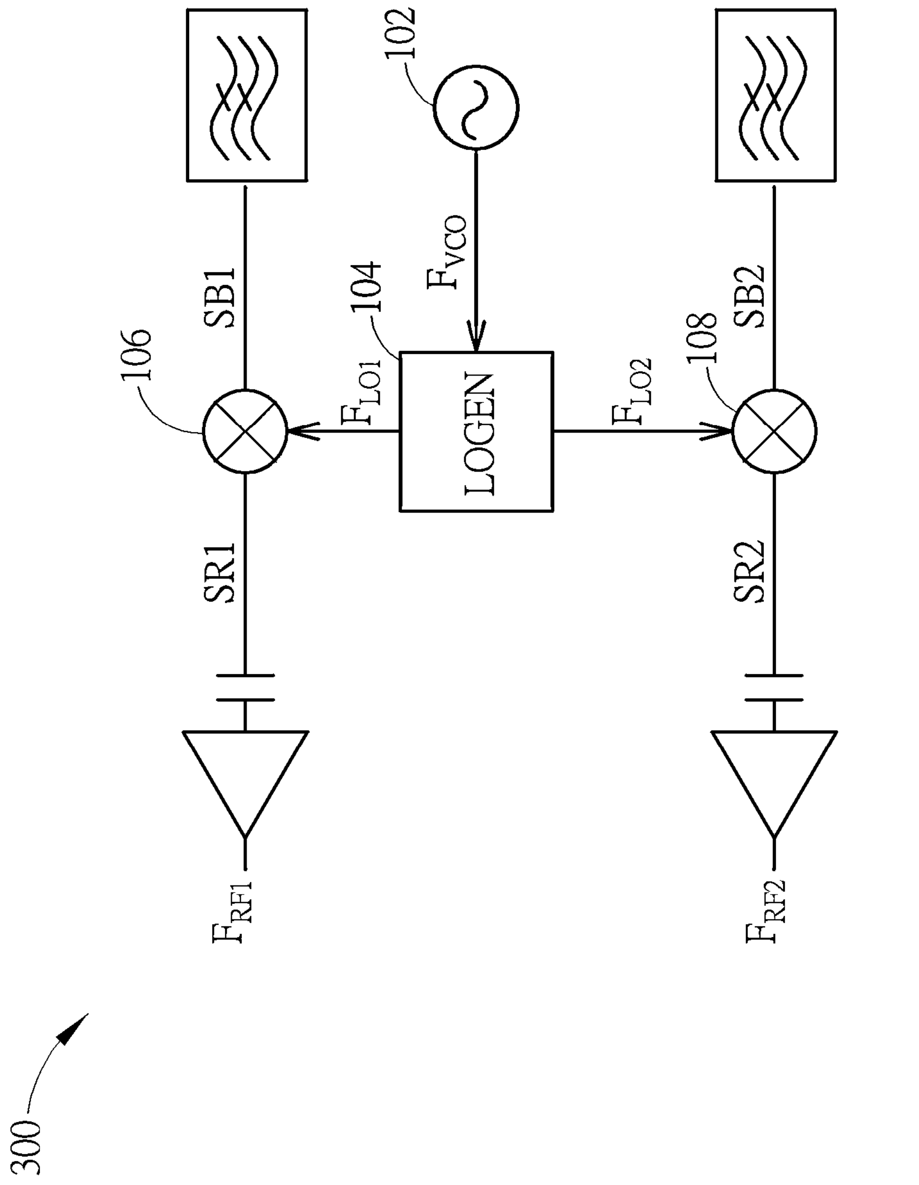
FIG. 3 is a diagram illustrating a second wireless communication system using the proposed RF system shown in FIG. 1 according to an embodiment of the present invention.

FIG. 3 is a diagram illustrating a second wireless communication system 300 using the proposed RF system 100 shown in FIG. 1 according to an embodiment of the present invention. In this embodiment, the mixer circuit 106 is located on one TX path for perform up-conversion upon a BB signal SB1 to generate an RF signal SR1 with an RF frequency $F_{RF1}$, and the mixer circuit 108 is located on another TX path for performing up-conversion upon a BB signal SB2 to generate an RF signal SR2 with an RF frequency $F_{RF2}$, where the RF frequencies $F_{RF1}$ and $F_{RF2}$ have a non-integer multiple relationship.

Figure 4:
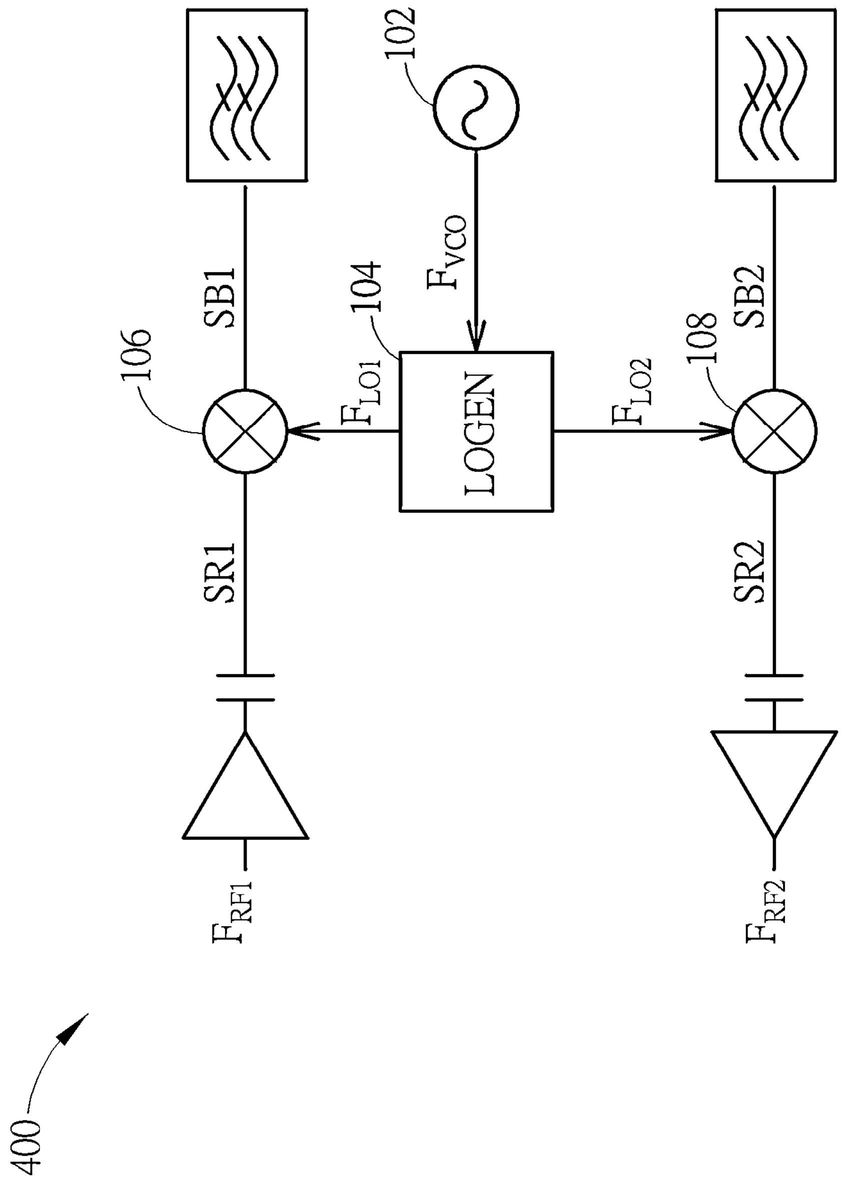
FIG. 4 is a diagram illustrating a third wireless communication system using the proposed RF system shown in FIG. 1 according to an embodiment of the present invention.

FIG. 4 is a diagram illustrating a third wireless communication system 400 using the proposed RF system 100 shown in FIG. 1 according to an embodiment of the present invention. In this embodiment, the mixer circuit 106 is located on an RX path for perform down-conversion upon an RF signal SR1 with an RF frequency $F_{RF1}$ to generate a BB signal SB1, and the mixer circuit 108 is located on a TX path for performing up-conversion upon a BB signal SB2 to generate an RF signal SR2 with an RF frequency $F_{RF2}$, where the RF frequencies $F_{RF1}$ and $F_{RF2}$ have a non-integer multiple relationship.

Compared to a conventional wireless communication system using multiple VCOs, a wireless communication system using the proposed RF system 100 is allowed to use only a single VCO for providing a single reference oscillation signal from which an LO signal generator generates multiple LO signals whose frequencies have a non-integer multiple relationship, thereby reducing the power consumption and the chip area. Compared to a conventional wireless communication system using a multi-stage mixer on each signal path, a wireless communication system using the proposed RF system 100 is allowed to use a single-stage mixer (i.e., only a single mixer) on each signal path, without a signal loss issue and a large LO driving current issue.

As mentioned above, the LO signal generator circuit 104 generates multiple LO signals $F_{LO1}$ and $F_{LO2}$ according to the same reference oscillation signal $F_{VCO}$ provided by a single frequency source (i.e., reference oscillation circuit 102). In this embodiment, the LO signal generator circuit 104 may include a frequency processing circuit 114 and a frequency combination circuit 116. The frequency processing circuit 114 is configured to generate a plurality of oscillation signals $F_A$, $F_B$, and $F_{LO1}$ (or $F_A$ & $F_B$=$F_{LO1}$, or $F_A$=$F_{LO1}$ & $F_B$) according to the reference oscillation signal $F_{VCO}$, where the frequency $f_{VCO}$ of the reference oscillation signal $F_{VCO}$ is an integer multiple of a frequency of each of the oscillation signals $F_A$, $F_B$, and $F_{LO1}$ (or $F_A$ & $F_B$=$F_{LO1}$, or $F_A$=$F_{LO1}$ & $F_B$). Each of the oscillation signals $F_A$, $F_B$, $F_{LO1}$ may have a 25% duty cycle. The LO signal $F_{LO1}$ is selected from the oscillation signals generated from the frequency processing circuit 114.

In this embodiment, an oscillation signal which acts as the LO signal $F_{Lo1}$ is distinct from the oscillation signals $F_A$ and $F_B$ that are provided to the frequency combination circuit 116. However, this is for illustrative purposes only, and is not meant to be a limitation of the present invention. In an alternative design, an oscillation signal which acts as the LO signal $F_{LO1}$ may be one of the oscillation signals $F_A$ and $F_B$ that are provided to the frequency combination circuit 116. In other words, the frequency processing circuit 114 may generate two oscillation signals $F_A$ and $F_B$ according to the same reference oscillation signal $F_{VCO}$, where one of the oscillation signals $F_A$ and $F_B$ may also act as the LO signal $F_{LO1}$ needed by the mixer circuit 106. In addition, each of the oscillation signals $F_A$ and $F_B$ may have a 25% duty cycle.

The frequency combination circuit 116 is configured to combine oscillation signals $F_A$ and $F_B$ to generate the LO signal $F_{LO2}$ needed by the mixer circuit 108. Each of the oscillation signals $F_A$ and $F_B$ may include a plurality of signals with the same frequency but different phases. For example, the oscillation signal $F_A$ may include two signals with the same frequency $f_A$ but different phases 0° and 90°, or may include four signals with the same frequency $f_A$ but different phases 0°, 90°, 180°, and 270°; and the oscillation signal $F_B$ may include two signals with the same frequency $f_B$ but different phases 0° and 90°, or may include four signals with the same frequency $f_B$ but different phases 0°, 90°, 180°, and 270°. The frequency $f_A$ may be the same or different from the frequency $f_B$.

Figure 5:
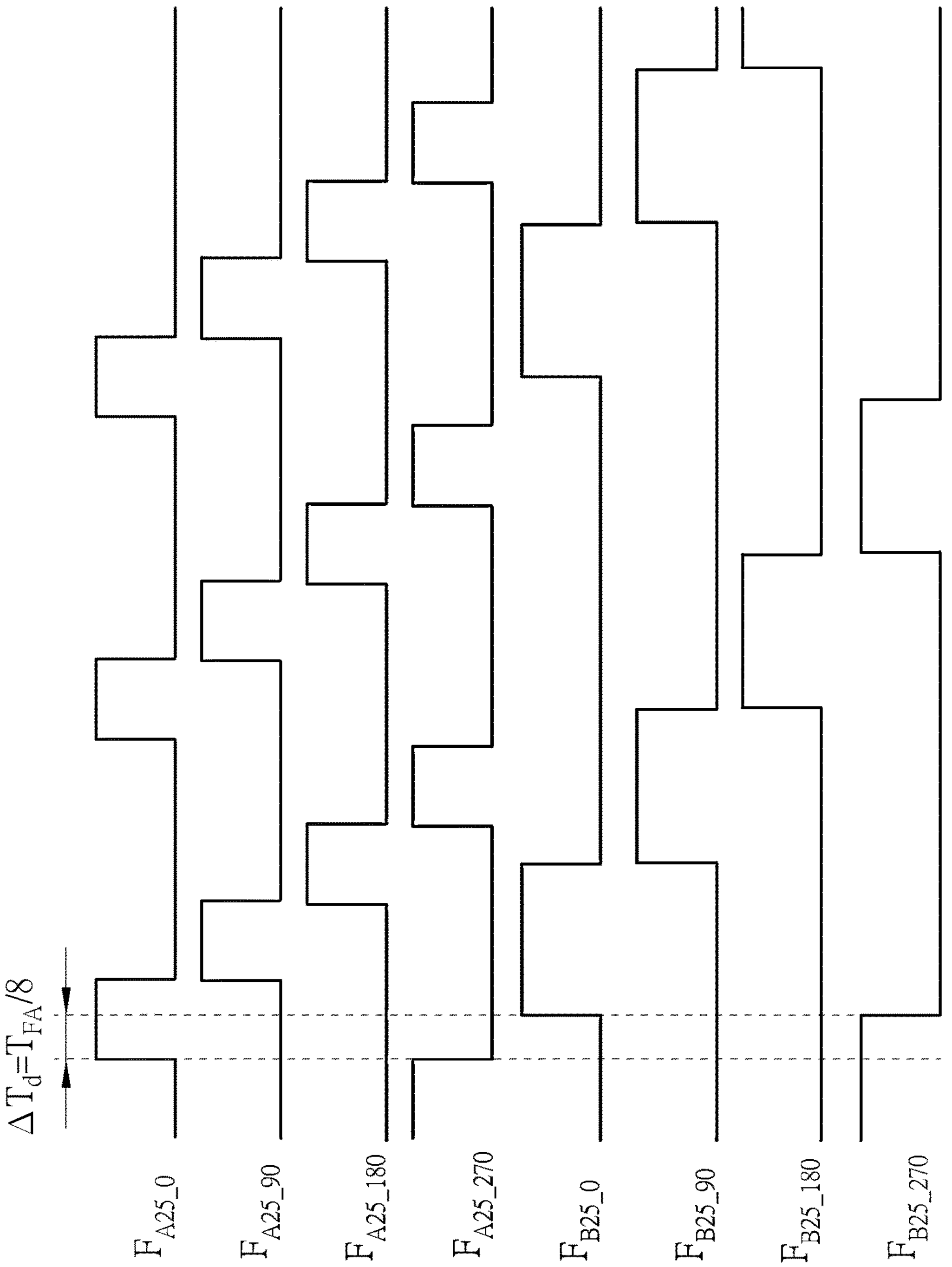
FIG. 5 is a diagram illustrating waveforms of oscillation signals according to an embodiment of the present invention.

In addition, the oscillation signals $F_A$ and $F_B$ combined at the frequency combination circuit 116 may have a specific time delay $\Delta T_d$ therebetween. Supposing that the frequency $f_A$ of the oscillation signal $F_A$ is not lower than the frequency $f_B$ of the oscillation signal $F_B$ (i.e., $f_A \geq f_B$), the specific time delay $\Delta T_d$ may be intentionally set by $$\left(\frac{T_{FA}}{8}\right) \times N,$$

where $T_{FA}$ is a period of the oscillation signal $F_A$, and N is an integer. FIG. 5 is a diagram illustrating waveforms of the oscillation signals $F_A$ and $F_B$ according to an embodiment of the present invention. The frequency of the oscillation signal $F_A$ is twice that of the oscillation signal $F_B$. The oscillation signal $F_A$ includes four signals $F_{A25\_0}$, $F_{A25\_90}$, $F_{A25\_180}$, $F_{A25\_270}$ with different phases 0°, 90°, 180°, and 270°. The oscillation signal $F_B$ includes four signals $F_{B25\_0}$, $F_{B25\_90}$, $F_{B25\_180}$, $F_{B25\_270}$ with different phases 0°, 90°, 180°, and 270°. The oscillation signals $F_A$ and $F_B$ have a specific time delay $$\Delta T_d = \frac{T_{FA}}{8}$$

between signals $F_{A25\_0}$ and $F_{B25\_0}$. It should be noted that the specific time delay $\Delta T_d$ is intentionally introduced between the oscillation signals $F_A$ and $F_B$ such that the LO signal $F_{LO2}$ can be generated through a proper combination of the oscillation signals $F_A$ and $F_B$. For example, the frequency $f_{LO2}$ of $F_{LO2}$ is equal to a sum of the frequency $f_A$ of the oscillation signal $F_A$ and the frequency $f_B$ of the oscillation signal $F_B$. The specific time delay $\Delta T_d$ may have impacts on TX/RX performance. In some embodiments of the present invention, the specific time delay $\Delta T_d$ may be set by $$\frac{T_{FA}}{8}, \frac{3 \cdot T_{FA}}{8}, \frac{5 \cdot T_{FA}}{8}, \text{ or } \frac{7 \cdot T_{FA}}{8}$$

for achieving the optimal TX/RX performance. However, this is for illustrative purposes only, and is not meant to be a limitation of the present invention.

Figure 6:
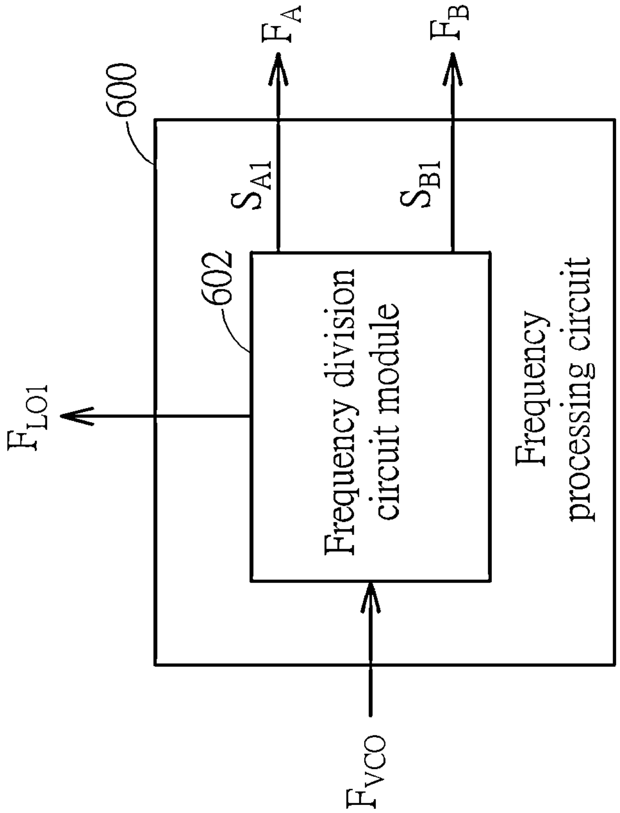
FIG. 6 is a diagram illustrating a first frequency processing circuit according to an embodiment of the present invention.

FIG. 6 is a diagram illustrating a first frequency processing circuit according to an embodiment of the present invention. The frequency processing circuit 114 shown in FIG. 1 may be implemented using the frequency processing circuit 600. As shown in FIG. 6, the frequency processing circuit 600 includes a frequency division circuit module 602. The frequency division circuit module 602 is configured to perform frequency division upon the reference oscillation signal $F_{VCO}$ (which may include a plurality of signals with the same frequency $f_{VCO}$ but different phases) to generate frequency division signals $S_{A1}$ and $S_{B1}$, and output the frequency division signals $S_{A1}$ and $S_{B1}$ as the oscillation signals $F_A$ and $F_B$, where the frequency $f_{VCO}$ of the reference oscillation signal $F_{VCO}$ is an integer multiple of each of the frequency division signals $S_{A1}$ and $S_{B1}$, each of the frequency division signals $S_{A1}$ and $S_{B1}$ may include a plurality of signals with the same frequency but different phases, and the frequency division signals $S_{A1}$ and $S_{B1}$ have the specific time delay $\Delta T_d$ $$\left(\text{e.g., } \Delta T_d = \left(\frac{T_{FA}}{8}\right) \times N\right)$$

therebetween. In other words, with a proper design of the frequency division circuit module 602, frequency division outputs can be directly used as the oscillation signals $F_A$ and $F_B$ needed for creating the LO signal $F_{LO2}$ at the frequency combination circuit 116.

Figure 7:
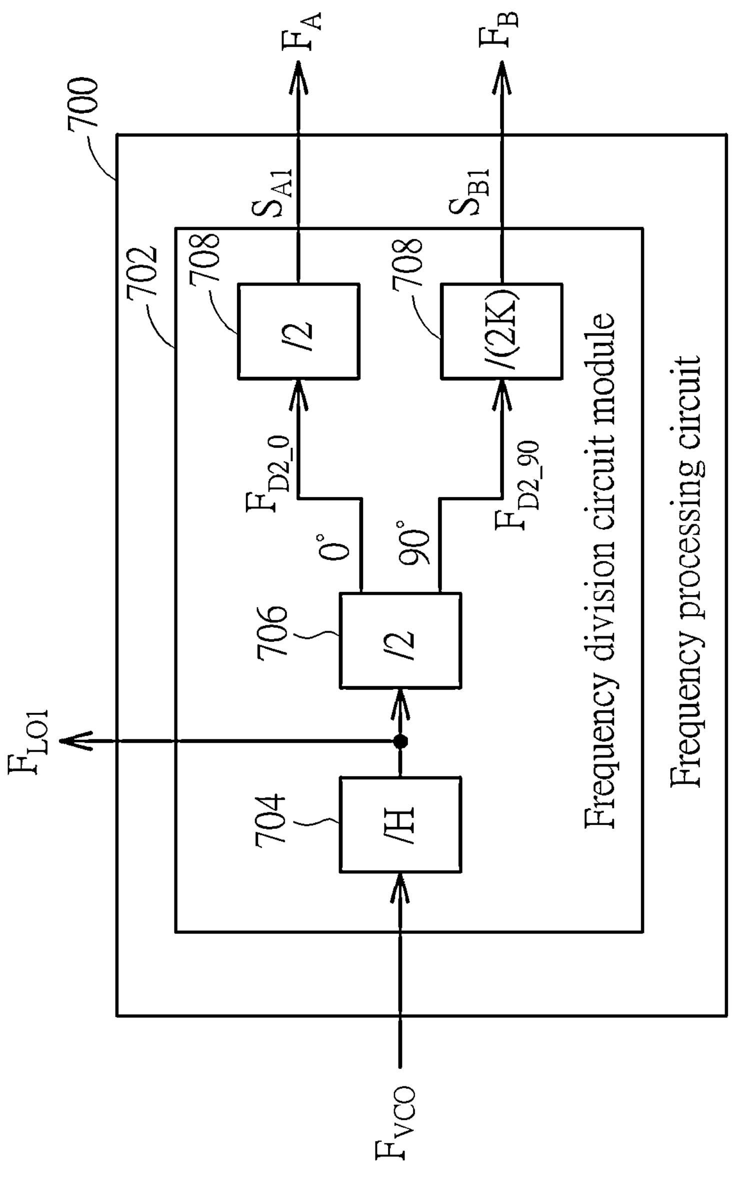
FIG. 7 is a diagram illustrating a second frequency processing circuit according to an embodiment of the present invention.

FIG. 7 is a diagram illustrating a second frequency processing circuit according to an embodiment of the present invention. The frequency processing circuit 700 may be regarded as one possible implementation of the frequency processing circuit 600. That is, the frequency division circuit module 602 may be implemented using the frequency division circuit module 702. As shown in FIG. 7, the frequency division circuit module 702 includes a plurality of frequency division circuits 704, 706, 708, and 710, where the frequency division circuit 704 is a divide-by-H circuit, the frequency division circuit 706 is a divide-by-2 circuit, the frequency division circuit 708 is a divide-by-2 circuit, and the frequency division circuit 710 is a divide-by-(2K) circuit, where H and K are positive integers. The LO signal $F_{LO1}$ is generated by the frequency division circuit 704. The frequency division circuit 706 generates a plurality of output signals with different phases. In this embodiment, one frequency division signal $F_{D2\_0}$ (which may include output signals with different phases 0° and 180°) is provided to the frequency division circuit 708, and another frequency division signal $F_{D2\_90}$ (which may include output signals with different phases 900 and 270°) is provided to the frequency division circuit 710. The frequency division signals $S_{A1}$ and $S_{B1}$ generated from the frequency division circuit module 702 can fulfill the specific time delay $\Delta T_d$ $$\left(\text{e.g., } \Delta T_d = \left(\frac{T_{FA}}{8}\right) \times N\right).$$

Figure 8:
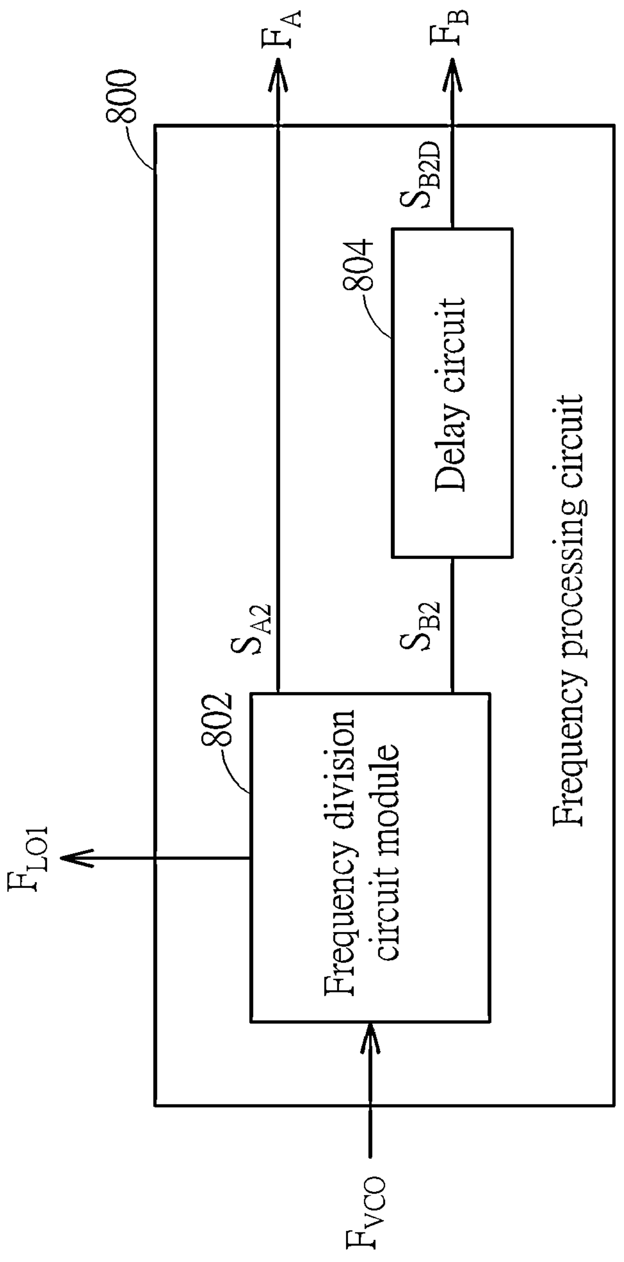
FIG. 8 is a diagram illustrating a third frequency processing circuit according to an embodiment of the present invention.

FIG. 8 is a diagram illustrating a third frequency processing circuit according to an embodiment of the present invention. The frequency processing circuit 114 shown in FIG. 1 may be implemented using the frequency processing circuit 800. As shown in FIG. 8, the frequency processing circuit 800 includes a frequency division circuit module 802 and a delay circuit 804. The frequency division circuit module 802 is configured to perform frequency division upon the reference oscillation signal $F_{VCO}$ (which may include a plurality of signals with the same frequency $f_{VCO}$ but different phases) to generate frequency division signals $S_{A2}$ and $S_{B2}$, and output the frequency division signal $S_{A2}$ as the oscillation signal $F_A$, where the frequency $f_{VCO}$ of the reference oscillation signal $F_{VCO}$ is an integer multiple of each of the frequency division signals $S_{A2}$ and $S_{B2}$. The delay circuit 804 is configured to receive the frequency division signal $S_{B2}$, generate a delayed frequency division signal $S_{B2D}$ through delaying the frequency division signal $S_{B2}$, and output the delayed frequency division signal $S_{B2D}$ as the oscillation signal $F_B$, where the delayed frequency division signal $S_{B2D}$ has the same frequency as the frequency division signal SB2. Each of the frequency division signals $S_{A2}$, $S_{B2}$, and $S_{B2D}$ may include a plurality of signals with the same frequency but different phases. The delayed frequency division signal $S_{B2D}$ and the frequency division signal $S_{A1}$ can fulfill the specific time delay $\Delta T_d$ $$\left(\text{e.g., } \Delta T_d = \left(\frac{T_{FA}}{8}\right) \times N\right).$$

Figure 9:
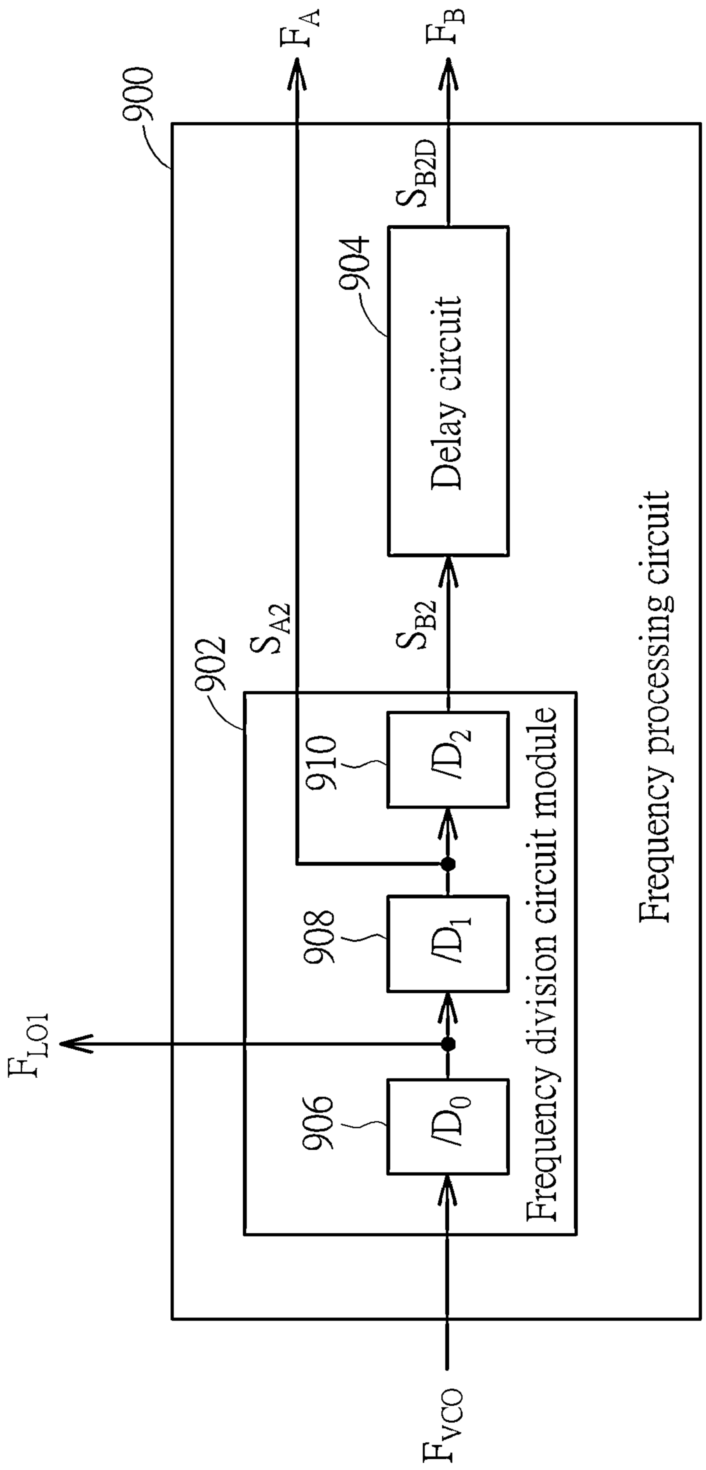
FIG. 9 is a diagram illustrating a fourth frequency processing circuit according to an embodiment of the present invention.

FIG. 9 is a diagram illustrating a fourth frequency processing circuit according to an embodiment of the present invention. The frequency processing circuit 900 may be regarded as one possible implementation of the frequency processing circuit 800. That is, the frequency division circuit module 802 may be implemented using the frequency division circuit module 902, and the delay circuit 804 may be implemented using the delay circuit 904. As shown in FIG. 9, the frequency division circuit module 902 includes a plurality of frequency division circuits 906, 908, and 910, where the frequency division circuit 906 is a divide-by-$D_0$ circuit, the frequency division circuit 908 is a divide-by-$D_1$ circuit, and the frequency division circuit 910 is a divide-by-$D_2$ circuit, where $D_0$, $D_1$ and $D_2$ are positive integers. The LO signal $F_{LO1}$ is generated by the frequency division circuit 906. The frequency division circuit 908 generates a frequency division signal which may include a plurality of signals with different phases. The frequency division signal output from the frequency division circuit 908 is used as the frequency division signal $F_A$, and is further used as an input signal of the frequency division circuit 910. The frequency division circuit 910 generates a frequency division signal which may include a plurality of signals with different phases. The frequency division signal output from the frequency division circuit 910 is used as the frequency division signal $F_B$ that is further processed by the following delay circuit 904.

The frequency combination circuit 116 generates the LO signal $F_{LO2}$ by a proper combination of oscillation signals $F_A$ and $F_B$, where each of the oscillation signals $F_A$ and $F_B$ may include a plurality of signals with the same frequency but different phases. In this embodiment, the frequency combination circuit 116 may include combinational logics, transmission-gate logics, or a combination thereof.

Figure 10:
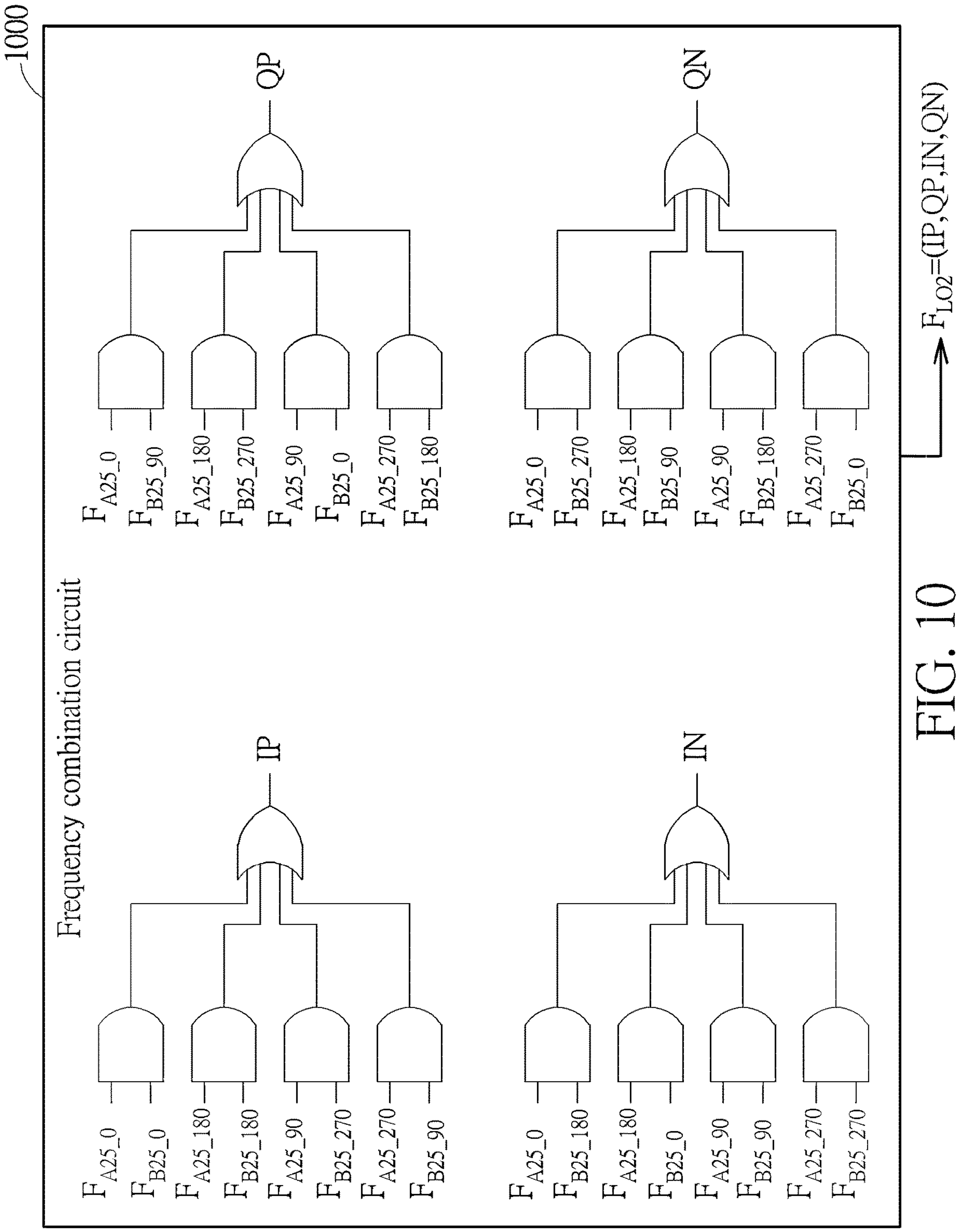
FIG. 10 is a diagram illustrating a first frequency combination circuit according to an embodiment of the present invention.

FIG. 10 is a diagram illustrating a first frequency combination circuit according to an embodiment of the present invention. The frequency combination circuit 116 may be implemented using the frequency combination circuit 1000. As shown in FIG. 10, the oscillation signal $F_A$ includes four signals $F_{A25\_0}$, $F_{A25\_90}$, $F_{A25\_180}$, $F_{A25\_270}$ with different phases 0°, 90°, 180°, and 270°, and the oscillation signal $F_B$ includes four signals $F_{B25\_0}$, $F_{B25\_90}$, $F_{B25\_180}$, $F_{B25\_270}$ with different phases 0°, 90°, 180°, and 270°. The frequency combination circuit 1000 is used to output the LO signal $F_{LO2}$ which includes four signals IP, QP, IN, and QN generated from combinational logics implemented using AND gates and OR gates. The logic circuits provide output rail-to-rail voltage swings without additional biasing circuitry.

Figure 11:
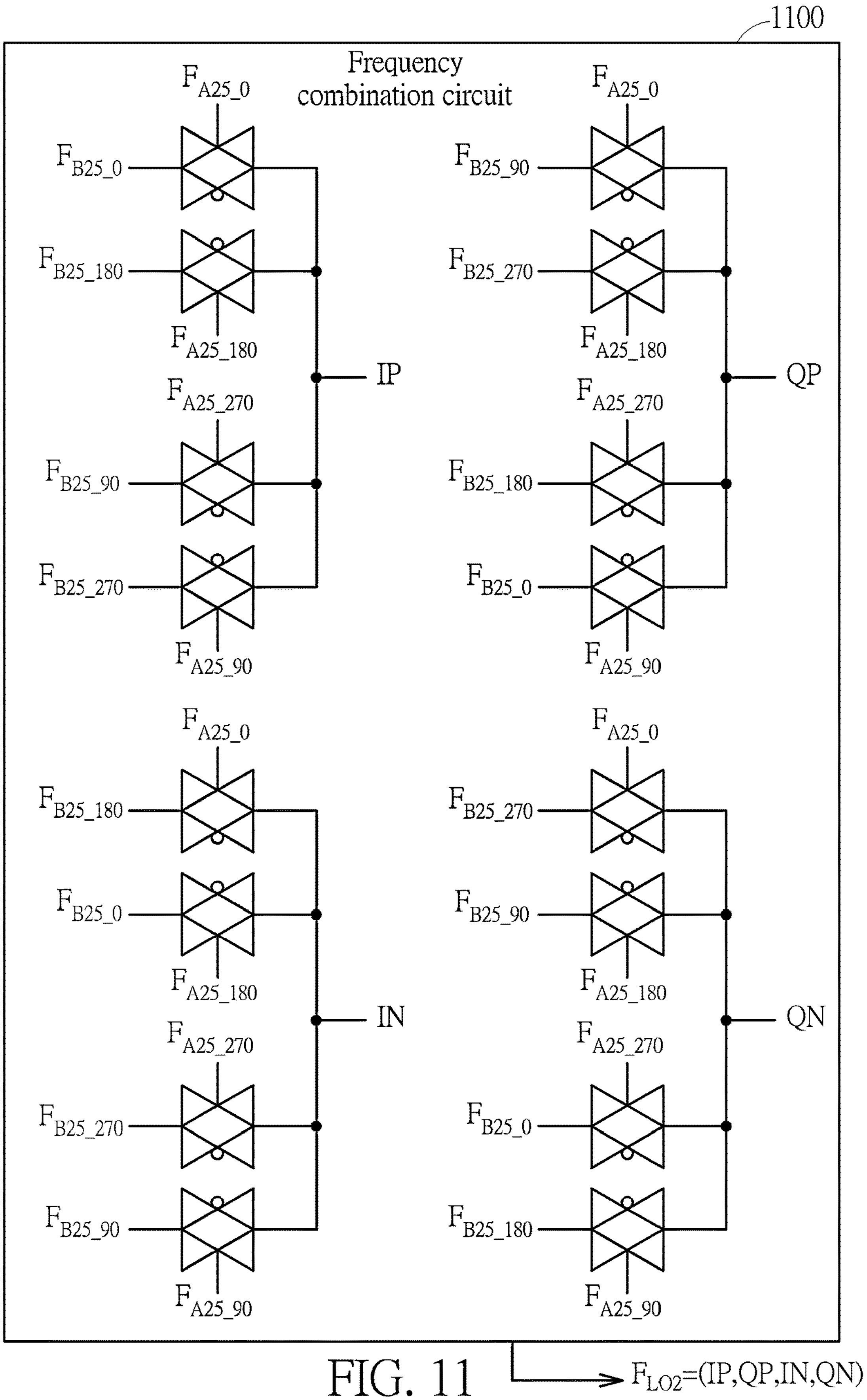
FIG. 11 is a diagram illustrating a second frequency combination circuit according to an embodiment of the present invention.

FIG. 11 is a diagram illustrating a second frequency combination circuit according to an embodiment of the present invention. The frequency combination circuit 116 may be implemented using the frequency combination circuit 1100. As shown in FIG. 11, the oscillation signal $F_A$ includes four signals $F_{A25\_0}$, $F_{A25\_90}$, $F_{A25\_180}$, $F_{A25\_270}$ with different phases 0°, 90°, 180°, and 270°, and the oscillation signal $F_B$ includes four signals $F_{B25\_0}$, $F_{B25\_90}$, $F_{B25\_180}$, $F_{B25\_270}$ with different phases 0°, 90°, 180°, and 270°. The frequency combination circuit 1100 is used to output the LO signal $F_{LO2}$ which includes four signals IP, QP, IN, and QN generated from transmission-gate logics. The logic circuits provide output rail-to-rail voltage swings without additional biasing circuitry.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-path radio frequency (RF) system comprising:

a reference oscillation circuit, configured to generate a reference oscillation signal;

a local oscillation (LO) generator circuit, configured to receive the reference oscillation signal, and generate a plurality of LO signals according to the reference oscillation signal, wherein a frequency of the reference oscillation signal is a non-integer multiple of a frequency of at least one of the plurality of LO signals; and a plurality of mixer circuits, located on a plurality of signal paths, respectively, and configured to receive the plurality of LO signals from the LO generator circuit, respectively;

wherein the LO generator circuit comprises:

a frequency processing circuit, configured to generate a plurality of oscillation signals according to the reference oscillation signal, wherein the frequency of the reference oscillation signal is an integer multiple of a frequency of each of the plurality of oscillation signals, and the plurality of LO signals comprise a first LO signal that is selected from the plurality of oscillation signals; and a frequency combination circuit, configured to combine at least a portion of the plurality of oscillation signals to generate a second LO signal included in the plurality of LO signals.

2. The multi-path RF system of claim 1, wherein there is only a single mixer circuit located on each of the plurality of signal paths.

3. The multi-path RF system of claim 1, wherein each of the plurality of LO signals has a 25% duty cycle.

4. The multi-path RF system of claim 1, wherein the reference oscillation signal comprises a plurality of signals with a same frequency but different phases.

5. The multi-path RF system of claim 1, wherein each of the plurality of LO signals comprises a plurality of signals with a same frequency but different phases.

6. The multi-path RF system of claim 1, wherein at least one of the plurality of signal paths is a transmit (TX) path.

7. The multi-path RF system of claim 1, wherein at least one of the plurality of signal paths is a receive (RX) path.

8. The multi-path RF system of claim 1, wherein each of the plurality of oscillation signals comprises a plurality of signals with the same frequency but different phases.

9. The multi-path RF system of claim 1, wherein each of the plurality of oscillation signals has a 25% duty cycle.

10. The multi-path RF system of claim 1, wherein the plurality of oscillation signals comprise a first oscillation signal and a second oscillation signal that are combined at the frequency combination circuit, and the first oscillation signal and the second oscillation signal have a specific time delay therebetween.

11. The multi-path RF system of claim 10, wherein the frequency processing circuit comprises:

a frequency division circuit module, configured to perform frequency division upon the reference oscillation signal to generate a first frequency division signal and a second frequency division signal, and output the first frequency division signal and the second frequency division signal as the first oscillation signal and the second oscillation signal, respectively.

12. The multi-path RF system of claim 11, wherein each of the first frequency division signal and the second frequency division signal comprises a plurality of signals with a same frequency but different phases.

13. The multi-path RF system of claim 10, wherein the frequency processing circuit comprises:

a frequency division circuit module, configured to perform frequency division upon the reference oscillation signal to generate a first frequency division signal and a second frequency division signal, and output the first frequency division signal as the first oscillation signal; and a delay circuit, configured to receive the second frequency division signal, generate a delayed frequency division signal through delaying the second frequency division signal, and output the delayed frequency division signal as the second oscillation signal.

14. The multi-path RF system of claim 13, wherein each of the first frequency division signal, the second frequency division signal, and the delayed frequency division signal comprises a plurality of signals with a same frequency but different phases.

15. The multi-path RF system of claim 10, wherein a frequency of the first oscillation signal is not lower than a frequency of the second oscillation signal, and the specific time delay is equal to $$\left(\frac{T_{FA}}{8}\right)\times N,$$

where $T_{FA}$ is a period of the first oscillation signal, and N is an integer.

16. The multi-path RF system of claim 10, wherein the frequency combination circuit generates the second LO signal by combining the first oscillation signal and the second oscillation signal, where a frequency of the second LO signal is equal to a sum of a frequency of the first oscillation signal and a frequency of the second oscillation signal.

17. The multi-path RF system of claim 1, wherein the frequency combination circuit comprises combinational logics, transmission-gate logics, or a combination thereof.

18. A local oscillation (LO) signal generation method comprising:

receiving a reference oscillation signal generated from a reference oscillation circuit;

generating a plurality of LO signals according to the reference oscillation signal, where a frequency of the reference oscillation signal is a non-integer multiple of a frequency of at least one of the plurality of LO signals; and outputting the plurality of LO signals to a plurality of mixer circuits that are located on a plurality of signal paths, respectively;

wherein generating the plurality of LO signals according to the reference oscillation signal comprises:

generating a plurality of oscillation signals according to the reference oscillation signal, wherein the frequency of the reference oscillation signal is an integer multiple of a frequency of each of the plurality of oscillation signals, and the plurality of LO signals comprise a first LO signal that is selected from the plurality of oscillation signals; and combining at least a portion of the plurality of oscillation signals to generate a second LO signal included in the plurality of LO signals.

19. The LO signal generation method of claim 18, wherein there is only a single mixer circuit located on each of the plurality of signal paths.

* * * * *